March 20, 1973 J. R. BLACK ET AL 3,720,997

EUTECTIC PLATING AND BREAKING SILICON WAFERS

Filed Jan. 11, 1971

INVENTOR.
James R. Black
Elliott Philofsky

BY Mueller & Aichele

ATTY'S.

United States Patent Office 3,720,997

Patented Mar. 20, 1973

3,720,997

EUTECTIC PLATING AND BREAKING SILICON WAFERS

James R. Black and Elliott Philofsky, Phoenix, Ariz., assignors to Motorola, Inc., Franklin Park, Ill.

Filed Jan. 11, 1971, Ser. No. 105,404
Int. Cl. B01j *17/00*
U.S. Cl. 29—583 5 Claims

ABSTRACT OF THE DISCLOSURE

A wafer of semiconductive material in the normal manufacture of making transistors or integrated circuits has many individual transistors or IC's produced on one side thereof and the other side thereof is coated with gold. Then the wafer is scribed, usually on the one side thereof, with scribe lines to assist in breaking the wafer into individual transistor or IC chips. As here disclosed a quenched silicon-gold alloy is produced on the other side of the wafer and the wafer is scribed. Since the quenched silicon-gold alloy is very brittle, the wafer breaks more easily on the scribe lines than do prior art scribed wafers.

BACKGROUND

Figure 1:
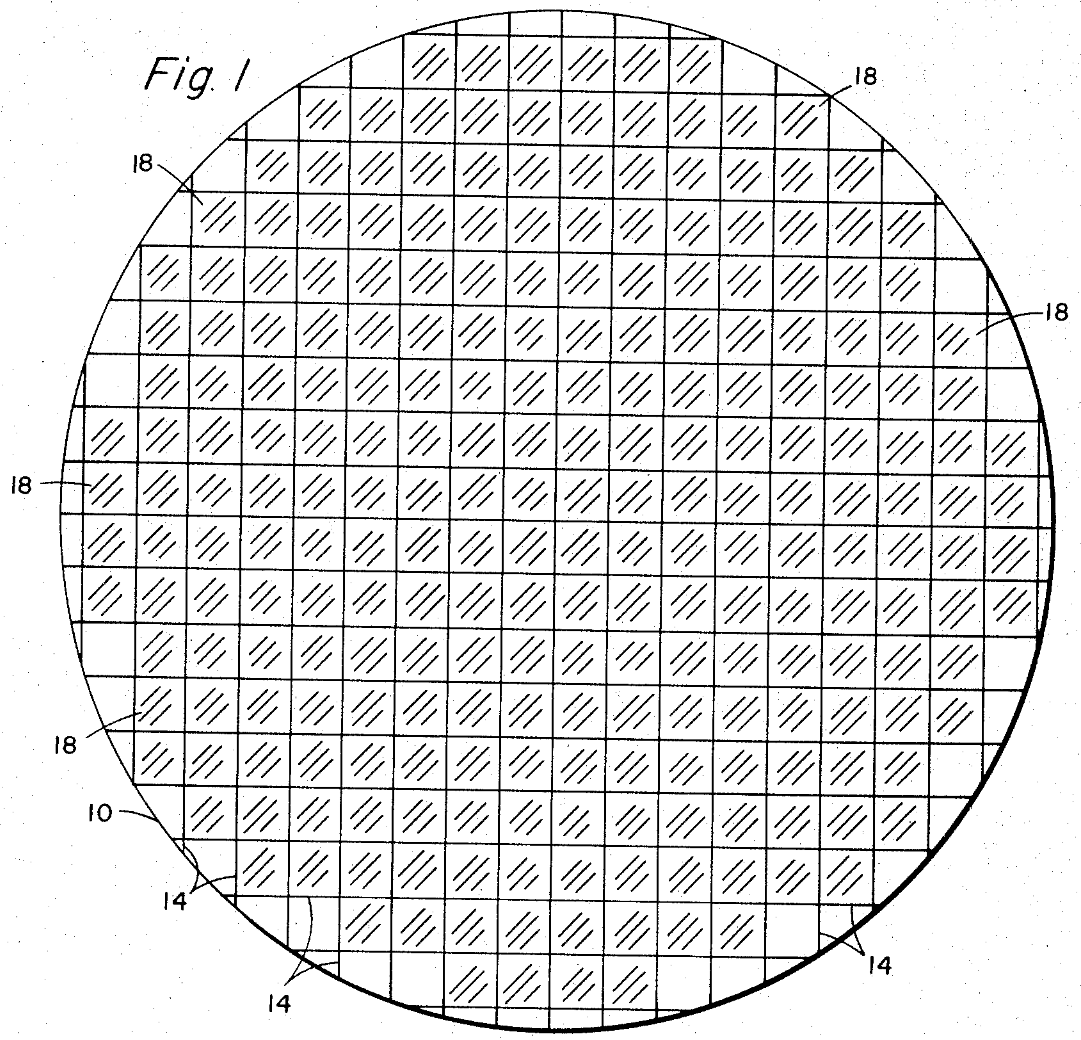

This invention relates to applying a brittle silicon-gold layer on a semiconductor body and to breaking up the silicon semiconductor wafer into individual transistor or IC chips.

In the normal method of making transistors or integrated circuits, hereinafter IC's, many transistors or IC's are put on one side of a semiconductor wafer of silicon, for example, and gold is deposited on the other side of the wafer whereby the other side of the wafer is coated with a ductile gold-silicon material. Then the wafer is scribed by a scribing tool between the individual transistors or IC's to produce break lines. Then the individual transistors or IC's are produced by breaking the wafer on the several scribed lines, resulting in square or rectangular chips, on each of which a transistor or an IC is found. The gold-silicon eutectic, being ductile, resists breaking, in fact, the chips may hinge and require effort to separate the chips and in separating the chips, the eutectic material may be torn off. Since the conductive eutectic material is necessary in a later process of mounting the chip on a substrate, the yield of useable chips is reduced by the ductile eutectic. It is not practical to coat the back of the individual separated chips with gold. In accordance with the prior art, the semiconductor material was itself scribed or other material was plated in scribe lines between the transistors or IC's on the wafer. When the semiconductor material was itself scribed, the scribe lines, to prevent the wafer from breaking along other than the proper scribe lines, had to be quite deep. As is known, when the wafer does not break cleanly on the scribe lines, many transistors or IC's are destroyed. When hinging occurs, extra effort is necessary to separate the chips and chips may be damaged while separating. Where other materials were plated on the wafer to be itself scribed, process steps were added to provide the pattern of material to be scribed, and furthermore, unless the other material, which was usually ductile, was scribed through, the other material itself added to the difficulty in breaking the wafer into chips.

It is an object of this invention to provide an improved method of breaking up a wafer into chips.

It is a further object of this invention to provide a wafer scribing and breaking method which results in better yield and less production cost.

SUMMARY

In accordance with this invention, the side of a wafer opposite the side in which the transistors or IC's are deposited, has deposited thereon a brittle layer of material and the wafer is scribed and the chips are produced by breaking the wafer on the scribe lines. The brittle layer may be produced by depositing a layer of gold on the said opposite side of a silicon wafer and baking the so plated silicon wafer until a liquid eutectic gold-silicon alloy is produced. The hot wafer is then quenched very quickly whereby the resulting metastable gold-silicon alloy layer is very brittle. Then the wafer is scribed and is broken on the scribe line. The wafer breaks cleanly into chips on the scribe line. The brittle gold-silicon alloy layer, while metastable for many days at room temperature, can be changed back into eutectic gold-silicon by heating to a lower temperature for several minutes. Therefore, when the chips are mounted on a substrate the gold-silicon eutectic layer can be used to form a bond with a substrate upon heating the chip and the substrate.

DESCRIPTION

Figure 2:
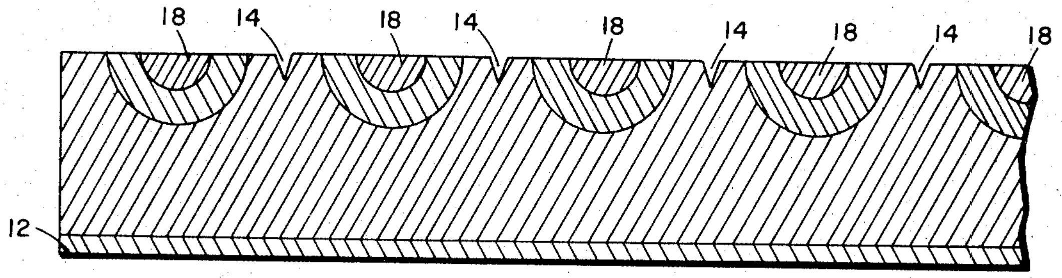
Figure 3:
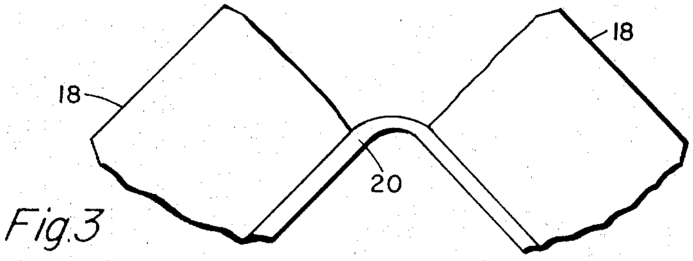

The invention will be better understood upon reading the following description in connection with the accompanying drawing in which FIGS. 1 and 2 illustrate the method of the invention, and FIG. 3 illustrates hinging of the prior art.

The top of a semiconductive silicon wafer 10 is shown in FIG. 1 and a fragment thereof is shown in elevation at a much larger scale in FIG. 2. The wafer 10 may have transistors or IC's 18 deposited on its front or top surface as shown in FIGS. 1 and 2. Then a layer of gold is deposited on the back, the lower surface as shown in FIGS. 2 and 3, of the wafer 10 and the wafer with the gold layer thereon is heated at about 370° C. until a liquid eutectic silicon-gold alloy layer 12 is formed on the back of the wafer. Then the wafer is quenched at a rate of more than 1000° C. per second, such as by depositing the wafer on a cold aluminum block or by dropping the wafer into cold water. The resultant layer 12 is then a silver colored metastable structure that is stable at room temperature for many days but will transform back to a gold layer on the silicon wafer when the wafer is heated to 200° C. and retained at that temperature for several minutes. However, while the layer 12 is still brittle, the wafer 10 is scribed along the scribe line 14 between the transistors 18 on the top of the wafer. It has been found that if enough energy is applied to the wafer 10 to cause it to break, it will break cleanly along the scribe lines 14 and produce the several chips, with very little loss or spoilage due to breaking other than on the scribe lines 14 and no "hinging," which is illustrated in FIG. 3, will occur. Hinging may occur when the eutectic gold-silicon layer 20 was in its ductile form at the time of breaking, as in the prior art.

Wafers have gold backs when completed, for the purpose of bonding the chips, when separated, to a substrate since it is impractical to back each individual chip with gold. By applying the gold alloy method as described hereinabove, the chip 16, after the breaking as described above, can have a eutectic gold-silicon backing by heating the chip 18 at 200° C. for several minutes or to a higher temperature for a shorter time. This heating step usually takes place when the chip is gold bonded to a substrate later in the process of producing a semiconductive device. If necessary, the layer of gold can be made thicker by gold plating in a known manner.

What is claimed is:

1. The method of producing a brittle metastable silicon-gold layer on a silicon body which comprises:
   plating one side of said silicon body with gold,
   heating said gold plated body to about 370° C. until a eutectic silicon-gold alloy is formed on said body,
   quenching said body at a cooling rate of more than 1000° C. per second, to produce a brittle metastable silicon-gold layer, and
   providing semiconductive devices on the opposite side of said body.

2. The invention of claim 1 in which said scribing is between said semiconductor devices.

3. The invention of claim 2 and including the additional step of breaking said wafer on said scribe lines to produce chips.

4. The invention of claim 3 and including the additional step of heating said chip at 200° C. for several minutes or to a higher temperature for a shorter period of time to change said brittle layer to a ductile one.

5. The invention of claim 4 in which said heating step is performed in bonding said chip to a substrate.

References Cited

UNITED STATES PATENTS

| | | | |
|---|---|---|---|
| 2,865,082 | 12/1958 | Gates | 29—583 |
| 3,532,539 | 10/1970 | Tokuyama et al. | 29—580 |
| 3,542,266 | 11/1970 | Woelfle | 29—583 |

CHARLES W. LANHAM, Primary Examiner

W. TUPMAN, Assistant Examiner

U.S. Cl. X.R.

29—591; 117—4